United States Patent
Lesso

(10) Patent No.: US 10,644,660 B2
(45) Date of Patent: May 5, 2020

(54) TRANSDUCER DRIVER CIRCUITRY

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/039,685

(22) Filed: Jul. 19, 2018

(65) Prior Publication Data

US 2019/0028072 A1 Jan. 24, 2019

Related U.S. Application Data

(60) Provisional application No. 62/536,128, filed on Jul. 24, 2017.

(30) Foreign Application Priority Data

Aug. 7, 2017 (GB) .................................. 1712648.3

(51) Int. Cl.
*H03F 3/45* (2006.01)
*H03F 3/217* (2006.01)
(Continued)

(52) U.S. Cl.
CPC ............. *H03F 3/2171* (2013.01); *H03F 1/32* (2013.01); *H03F 1/34* (2013.01); *H03F 3/183* (2013.01);
(Continued)

(58) Field of Classification Search
CPC ........................................................ H03F 3/45
(Continued)

(56) References Cited

U.S. PATENT DOCUMENTS 5,770,940 A * 6/1998 Goder ..................... G05F 1/565
                                                      323/282
7,279,875 B2 * 10/2007 Gan ..................... H02M 3/1588
                                                      323/282
(Continued)

FOREIGN PATENT DOCUMENTS

CN          101388595 A      3/2009
JP          2010045517 A     2/2010
(Continued)

OTHER PUBLICATIONS

Combined Search and Examination Report under Sections 17 and 18(3), UKIPO, Application No. GB1712648.3, dated Feb. 6, 2018.

*Primary Examiner* — Henry Choe
(74) *Attorney, Agent, or Firm* — Jackson Walker L.L.P.

(57) ABSTRACT

This application relates to method and apparatus for driving acoustic transducers, such as speakers or haptic transducers. A transducer driver circuit (200) has a hysteretic comparator (201) configured to compare, with hysteresis, an input signal ($S_{IN}$) received at a first comparator input to a feedback signal ($S_{FB}$) received at a second comparator input. Based on the comparison the hysteretic comparator (201) generates a pulse-width modulation (PWM) signal ($S_{PWM}$) at a comparator output (206). An inductor (203) is coupled between the comparator output and an output node (204). In use a resistive component (208), which may comprise the transducer (301) is coupled to output node (204). The inductor (203) and resistive component (208) provide filtering to the PWM signal ($S_{PWM}$). A feedback path extends between the output node (204) and the second comparator input to provide the feedback signal ($S_{FB}$).

17 Claims, 5 Drawing Sheets

(51) Int. Cl.
*H03F 1/34* (2006.01)
*H03F 1/32* (2006.01)
*H03F 3/183* (2006.01)

(52) U.S. Cl.
CPC ....... *H03F 3/2173* (2013.01); *H03F 3/45183* (2013.01); *H03F 2200/03* (2013.01)

(58) Field of Classification Search
USPC .......................................... 330/260, 252, 10
See application file for complete search history.

(56) References Cited

U.S. PATENT DOCUMENTS

| | | | | |
|---|---|---|---|---|
| 7,492,132 | B2* | 2/2009 | Kuroiwa | H02M 3/156 |
| | | | | 323/222 |
| 7,541,867 | B2* | 6/2009 | Taylor | H04L 27/361 |
| | | | | 330/136 |
| 10,365,166 | B2* | 7/2019 | Phan Le | G01S 15/885 |
| 2002/0005753 | A1 | 1/2002 | Takagishi | |
| 2007/0018719 | A1 | 1/2007 | Seven | |
| 2007/0057721 | A1 | 3/2007 | Risbo et al. | |
| 2007/0114983 | A1 | 5/2007 | Weng et al. | |
| 2011/0267018 | A1* | 11/2011 | Tao | H02M 3/1563 |
| | | | | 323/282 |
| 2013/0127361 | A1 | 5/2013 | Weng | |
| 2014/0085064 | A1 | 3/2014 | Crawley et al. | |
| 2017/0085180 | A1* | 3/2017 | Pulici | H02M 3/156 |
| 2017/0141685 | A1* | 5/2017 | Cannankurichi | H02M 3/158 |

FOREIGN PATENT DOCUMENTS

| | | |
|---|---|---|
| KR | 20000061592 A1 | 10/2000 |
| WO | 2004040752 A1 | 5/2004 |

\* cited by examiner

TRANSDUCER DRIVER CIRCUITRY

TECHNICAL FIELD

This application relates to methods and apparatus for driving transducers and in particular to circuitry for driving acoustic transducers such as loudspeakers or haptic or ultrasonic transducers or the like.

BACKGROUND INFORMATION

Many electronic devices include acoustic output transducers, i.e. transducers for converting a suitable electrical driving signal into an acoustic output such as a sonic pressure wave or mechanical vibration. For instance many devices may include one or more loudspeakers for sound generation, e.g. for playback of audio content or voice communications and/or providing audible notifications. Some devices may also include transducers capable of generating ultrasonic waves, e.g. for proximity detection type applications and/or machine-to-machine communication. Many electronic devices may additionally or alternatively include haptic transducers for generating vibrations, e.g. for haptic control feedback or notifications to a user. Additionally or alternatively an electronic device may have a connector for making a removable mating connection with a corresponding connector of an accessory apparatus and a may be arranged to provide a driving signal to the connector so as to drive a transducer, of one or more of the types mentioned above, of the accessory apparatus when connected.

Such an electronic device will thus comprise driving circuitry for driving the transducer of the host device or connected accessory with a suitable driving signal. For acoustic transducers the driving signal will generally be an analogue time varying voltage signal, i.e. some time varying waveform.

Especially for electronic devices that may be operable in a battery powered mode, e.g. portable electronic devices, power consumption may be a concern and relatively low power consumption may be desirable. For this reason some transducer driving circuits may be implemented using a Class D amplifier.

FIG. 1 illustrates one example of a conventional signal path for driving a transducer using a Class D amplifier. An input signal $S_{IN1}$ is received and input to a PWM modulator block 101. The PWM modulator block 101 also receives a reference signal $S_{REF}$ and generates a PWM signal $S_{PWM1}$ with a duty cycle that depends on the level of the input signal $S_{IN1}$. The PWM signal $S_{PWM1}$ is used to control switching of an output power stage 102 to generate an output signal $S_{OUT1}$, which may, in some instances, effectively be an amplified version of the PWM signal $S_{PWM1}$. The output signal is filtered by a low-pass filter 103 to generate an analogue driving signal $S_{D1}$ which is supplied to drive the transducer 104.

In some instances the input signal $S_{IN}$ may be compared, by the PWM modulator block 101, to the reference signal $S_{REF}$ which comprises a cyclic reference waveform. In other instances however the PWM modulator block 101 may receive a feedback signal $S_{FB1}$, as illustrated by the dashed line, that is indicative of the output signal $S_{OUT1}$ (or in some instances the driving signal $S_{D1}$) and compare an error between the input signal $S_{IN}$ and the feedback signal $S_{FB1}$ to the reference $S_{REF1}$.

Typically the PWM modulator block 101 and output stage 102 may be formed as part of an integrated circuit (IC). The filter 103 may, in some instances, be formed at least partly by components external to the integrated circuit, i.e. off-chip. The transducer 104 may be a transducer of the host device that houses the rest of the signal path, but in some instances the transducer 104 could be transducer of an accessory apparatus that is removably connected via some suitable connector, e.g. a plug-and-socket arrangement or some other plug-and-receptacle connector, e.g. USB, USB-C, Lightning connector etc.

Whilst such transducer driving circuitry can be used satisfactorily in many applications, there is a general desire for ever smaller and/or lower power consumption circuitry, especially in applications where relatively high quality signal reproduction may not be required.

SUMMARY OF EMBODIMENTS

Embodiments of the disclosure relate to improved transducer driving circuitry.

According to one aspect there is provided a transducer driver circuit for driving a signal waveform into an acoustic transducer to provide an acoustic output therefrom comprising:

a hysteretic comparator configured to compare, with hysteresis, an input signal received at a first comparator input to a feedback signal received at a second comparator input and to generate a pulse-width modulation (PWM) signal at a comparator output;

an inductor coupled between the comparator output and an output node; and a feedback path between the output node and the second comparator input to provide the feedback signal.

In some embodiments the transducer driving circuit may further comprise a hysteresis controller for controlling hysteresis of the hysteretic comparator.

In some embodiments the hysteresis controller may be configured to control the hysteresis of the hysteretic comparator based on the PWM signal. The circuit may further comprise a time-to-digital-converter configured to receive the PWM signal and output a digital control signal based on a parameter of the PWM signal. The hysteresis controller may be configured to receive the digital control signal. The parameter may comprise one of: a duration of a cycle period of the PWM signal; a duty-cycle of the PWM signal or a duration of a pulse of the PWM signal. The time-to-digital converter may be configured to receive a reference clock signal and may comprise a counter configured to produce at least one count value of the number of clock cycles of the reference clock signal in a period defined by the parameter of the PWM signal.

In some embodiments the hysteresis controller may be configured to control the hysteresis of the hysteretic comparator based on an indication of the input signal, e.g. an indication or estimate of the signal level. The hysteresis controller may be configured to receive said indication of the input signal from a module acting on the signal path for providing the input signal to the transducer driving circuit, i.e. acting on the signal path upstream of the transducer driving circuit. In some embodiments the indication of the input signal may be a look-ahead signal, such that the input signal received by the transducer driving circuit is delayed with respect to the indication of the input signal.

The transducer driving circuit may, in use, further comprise a transducer coupled to be driven by a driving signal at the output node. In some instances the transducer may comprise a resistive load, in which case in some embodiments the circuit may further comprise a capacitance connected between the output node and a reference potential. In some embodiments the transducer may comprise a capacitive load. In which case, in some instances, the transducer driving circuit may comprise a resistance in series between the transducer and the output node. In some instance the transducer may comprise a mixed resistive and capacitive load.

The transducer may comprise a piezoelectric transducer. The transducer may comprise at least one of: a haptic output transducer; an ultrasonic output transducer and an audible audio output transducer.

In some embodiments the hysteretic comparator may be formed as at least part of an integrated circuit. The inductor may be an external component to the integrated circuit and coupled to the integrated circuit or may be integrated as part of the integrated circuit. When the circuit includes a hysteresis controller, for controlling the hysteresis applied, the hysteresis controller may be integrated as part of the integrated circuit. If the circuit also has a time-to-digital converter, the time-to-digital converter may also be integrated as part of the integrated circuit.

In some instances however the hysteretic comparator may not be implemented as part of an integrated circuit. For example the hysteretic comparator may be formed from components on a printed circuit board. The transducer driving circuit may be coupled to a first output of an integrated circuit and may be operable so that an analogue output signal at said first output can be supplied to the hysteretic comparator as said input signal. In some implementations the transducer driving circuit is coupled to said first output of the integrated circuit via a switch arrangement, wherein the switch arrangement is operable to selectively supply the analogue output signal at the first output to either the hysteretic comparator or to a second signal path. The second signal path may lead to a contact of a device connector for making a connection with a removable accessory apparatus.

The transducer driving circuit as described in any of the variants above may be implemented in an electronic device. The electronic device may be at least one of: a battery powered device; a portable device; a communications device; a mobile telephone; a smartphone; a computing device; a laptop; notebook or tablet computer; a gaming device; a personal media player; a wearable device; a voice controlled device.

In a further aspect there is provided a transducer driver circuit comprising:
an input node for receiving an input signal waveform;
an output node for outputting a driving signal waveform to a transducer load to drive an acoustic output;
a hysteretic comparator having a first comparator input and a second comparator input and configured to generate a pulse-width modulation (PWM) signal at a comparator output;
the first comparator input being configured to receive the input signal waveform from the input node;
an inductor coupled between the comparator output and the output node; and
a feedback path between the output node and the second comparator input;
wherein, in use, the inductor and the transducer load collectively form at least part of a filter for filtering the PWM signal.

In a further aspect there is provided a transducer driver circuit for driving a transducer comprising:
an input node for receiving an input signal waveform;
a PWM node for outputting a pulse-width modulation (PWM) signal to a transducer via an inductor;
a feedback node for receiving a feedback signal from downstream of the inductor;
a hysteretic comparator having a first comparator input coupled to the input node; a second comparator input coupled to the feedback node and a comparator output coupled to the PWM node, the hysteretic comparator being configured to compare the feedback signal to the input signal to generate the PWM signal.

The transducer driver circuit may further comprise a hysteresis controller for controlling a hysteresis of the hysteretic comparator based on the PWM signal.

In a further aspect there is provided a transducer driver circuit for driving a signal waveform into an acoustic transducer to provide an acoustic output therefrom comprising:
a hysteretic comparator configured to compare, with hysteresis, an input signal received at a first comparator input to a feedback signal received at a second comparator input and to generate a pulse-width modulation (PWM) signal at a comparator output; and
an inductor coupled between the comparator output and an output node;
wherein the feedback signal is tapped from one point of a signal path between the comparator and the acoustic transducer which is downstream of the inductor.

In a further aspect there is provided a circuit for driving a transducer, the circuit comprising:
a hysteretic comparator comprising: a first input node for receiving an input signal waveform; a second input node for receiving a feedback signal; and an output node for outputting a pulse-width modulation (PWM) signal that is based on a hysteretic comparison of the input signal waveform and the feedback signal; and
an inductor coupled between the output node and the second input node;
wherein, in use, the transducer is coupled to the second input node.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Embodiments relate to methods and apparatus for generating driving signals for driving transducers and, in particular, for driving of acoustic transducers such as loudspeakers, ultrasonic transducers, haptic transducers and the like. In particular, some embodiments relate to transducer driving circuitry having a hysteretic comparator configured to compare, with hysteresis, an input signal received at a first comparator input to a feedback signal received at a second comparator input and to generate a pulse-width modulation (PWM) signal at a comparator output. An inductor is coupled between the comparator output and an output node and a feedback path extends between the output node and the second comparator input to provide the feedback signal.

The transducer driving circuitry is advantageous in that it can be implemented in a relatively small circuit implementation, especially for smaller IC process node geometries, and can be implemented with relatively low power consumption.

Figure 2:
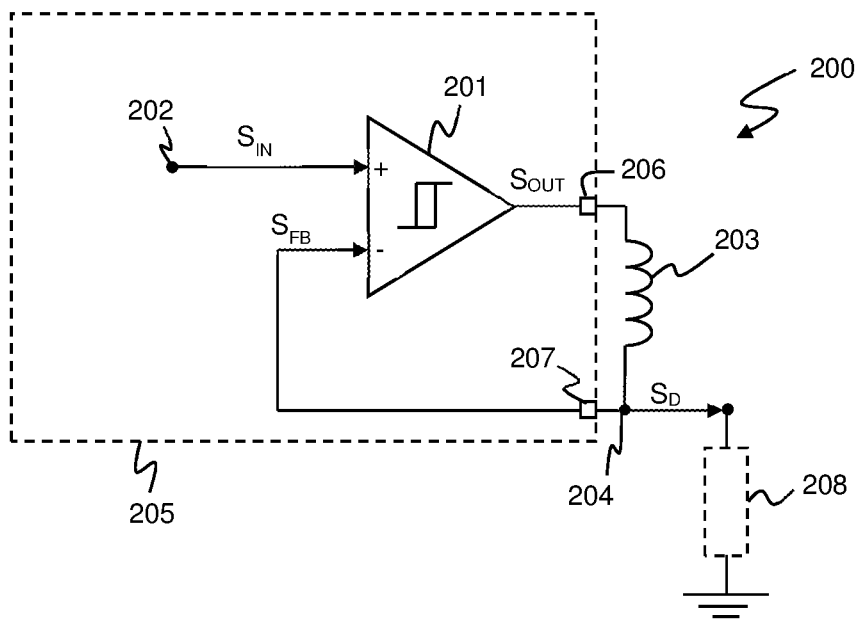
FIG. 2 illustrates one example of an embodiment of transducer driving circuitry.

FIG. 2 illustrates the general form of transducer driving circuitry 200 according to an embodiment. Hysteretic comparator 201 is arranged to receive an input signal $S_{IN}$ from input node 202. The input signal $S_{IN}$ is a time varying input signal comprising some encoded content that is used to drive the transducer. For example the input signal $S_{IN}$ may be an audio signal representative of some sound to be generated by a speaker.

The input node 202 may be some terminal or contact for receiving the input signal $S_{IN}$, e.g. a pad of an integrated circuit, or an output of some upstream processing block/circuitry or could just be a suitable node of a signal path. The input signal $S_{IN}$ is provided to a first comparator input (+) of the hysteretic comparator 201.

The hysteretic comparator 201 compares the input signal $S_{IN}$ at the first comparator input with a feedback signal $S_{FB}$ received at a second comparator input (−) and generates an output signal $S_{OUT}$ based on the comparison. The hysteretic comparator 201 is operable to apply hysteresis to the comparison.

An inductor 203 is coupled between the output of the comparator 201 and an output node 204 and a feedback path also extends from the output node 204 to the second comparator input for providing a feedback signal $S_{FB}$ to the second comparator input.

In some implementations the hysteretic comparator 201 may be implemented as at least part of an integrated circuit 205, which may for instance be an audio circuit such as a codec or the like. In some instances it may be possible to integrate a suitable inductor 203 as part of the integrated circuit 205. In which case the output node 204 may be part of the integrated circuit 205 and could for instance be a terminal of the integrated circuit 205, e.g. a contact pad or the like, or may be any suitable node of the signal path for the output signal $S_{OUT}$. In other implementations, as illustrated in FIG. 2, the inductor 203 could be an external component to an integrated circuit 205, i.e. off-chip component. In which case the integrated circuit 205 may include a PWM node 206, e.g. a suitable output terminal, for outputting the comparator output, and a feedback node 207, e.g. a suitable input terminal, for receiving the feedback signal $S_{FB}$.

In use, the output node 204 will be coupled to a resistive component 208. The resistive component 208 may, in some cases, comprise the transducer to be driven, for instance a loudspeaker or similar as will be described in more detail below. Additionally or alternatively the resistive component 208 could be a resistive component other than transducer which is connected to the output node, and could for instance be an on-chip resistor (e.g. coupled to the feedback path extending from feedback node 207) or off-chip resistor.

The inductor 203 together with resistive component 208 thus, in use, acts as a filter for filtering the PWM output signal $S_{OUT}$ which is output from the hysteretic comparator 201. This means that the signal $S_D$ at the output node is an analogue driving signal which is suitable for driving the transducer. The feedback signal $S_{FB}$ which is derived from the output node 204 is thus an indication of the driving signal $S_D$. In the example illustrated in FIG. 2, with just a resistive component coupled between the output node 204 and a reference potential, e.g. ground, the inductor 203 and resistive component provide low-pass filtering.

The hysteretic comparator 201 compares the signals at the first and second comparator inputs, i.e. the input signal $S_{IN}$ and the feedback signal $S_{FB}$, and outputs either of two output states, $V_H$ and $V_L$, depending on the result of the comparison. The hysteretic comparator 201 is operable to apply hysteresis to the comparison such that a differential voltage between the signals $S_{IN}$ and $S_{FB}$ at the first and second comparator inputs must be greater (i.e. more positive or less negative) than a first threshold to transition from one output state to the other, say from output state $V_L$ to the output state $V_H$, but must be lower (i.e. less positive or more negative) than a second, different threshold to make the opposite transition, e.g. to swap from the output state $V_H$ to the output state $V_L$. The difference between these first and second thresholds corresponds to the amount of hysteresis applied. In some implementations the first and second thresholds may be equal in magnitude and opposite in polarity, i.e. the difference between the input signal $S_{IN}$ and the feedback signal $S_{FB}$ must be greater than an amount +H to transition to one state, say $V_H$, and must be lower than −H to transition to the other state. In this instance the magnitude of H can be seen as a measure of the hysteresis applied by the hysteretic comparator 201. However other arrangements could be implemented.

The output states $V_H$ and $V_L$ may be high and low voltage levels respectively, for instance a supply voltage $V_{DD}$ and ground, or a positive voltage and a negative voltage, possibly of equal magnitude. Thus the output signal $S_{OUT}$ may be a square wave type voltage signal produced as the hysteretic comparator 201 transitions between the two output voltage states.

The inductor 203 is thus driven, on one side, i.e. at PWM node 206, by the output signal $S_{OUT}$ that alternates between the high voltage $V_H$ and the low voltage $V_L$. The inductor 203 will (in use connected in series with resistance 208), provide some averaging, or low pass filtering, as will be understood by one skilled in the art, so the voltage at the output node 204 will be somewhere within the range $V_H$ to $V_L$, with the actual voltage depending on the proportion of time spent in the high state $V_H$ compared to the low state $V_L$.

The hysteretic comparator 201 thus effectively compares the voltage at the output node 204 (via the feedback signal $S_{FB}$) to the input signal $S_{IN}$. If the feedback signal $S_{FB}$ drops below the input signal $S_{IN}$ by the relevant amount of hysteresis, the hysteretic comparator 201 will swap to the high output state $V_H$. At this point there will be a positive voltage difference across the inductor 203 and the inductor current, and voltage at the output node 204, will ramp up. This ramp will continue until the first threshold is reached, e.g. feedback signal $S_{FB}$ exceeds the input signal $S_{IN}$ by the relevant hysteresis amount, say +H, at which case the hysteretic comparator 201 will swap to the low output state $V_L$. At this point the inductor current, and voltage at the output node 204 will ramp down until the relevant threshold is reached and the output swaps state again.

Thus the hysteretic comparator 201 will continually cycle between the first and second output states $V_H$ and $V_L$ in order to maintain the voltage at the output node 204 to be the same as the input signal $S_{IN}$ (within the defined hysteresis limit).

Figure 1:
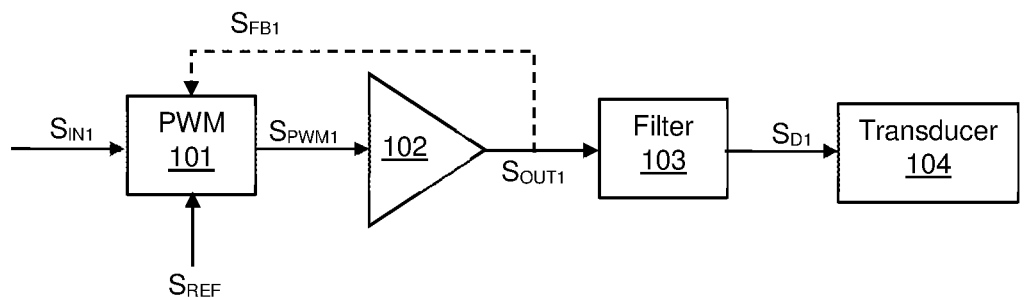
FIG. 1 illustrates one example of a conventional Class D signal path for driving a transducer.

In effect the hysteretic comparator 201 with inductor 203 and the feedback path replaces the functionality of the PWM modulator 101, output stage 102 and filter 103 discussed with reference to FIG. 1. This provides a very compact transducer driver circuit arrangement, which is also power efficient as all energy supplied to inductor 203 is available for a load connected to the output node 204. Also the feedback is taken from the output node 204 which couples to the load, rather than being taken before any filtering component in series with the load. This means that the output accuracy is not impaired by any non-linearity or pass-band filter ripple of any filter component, i.e. the output signal to the transducer accurately corresponds to the input signal $S_{IN}$ (disregarding any higher-frequency residual sideband components due to the PWM switching). Thus the feedback signal $S_{FB}$ supplied to the second comparator input of the hysteretic comparator is derived wholly from downstream of the inductor, i.e. from the signal path between the inductor and the transducer. As illustrated the feedback signal may be tapped from one point of the signal path between the comparator output and the transducer, and the tap point is downstream of the inductor. Thus the PWM signal $S_{OUT}$ only contributes to the feedback signal after having passed via the inductor 203 (there is no significant contribution to the feedback signal $S_{OUT}$ before filtering by the inductor 203), i.e. all signal components of the feedback signal are derived from a signal path between the inductor and the transducer.

Figure 3:
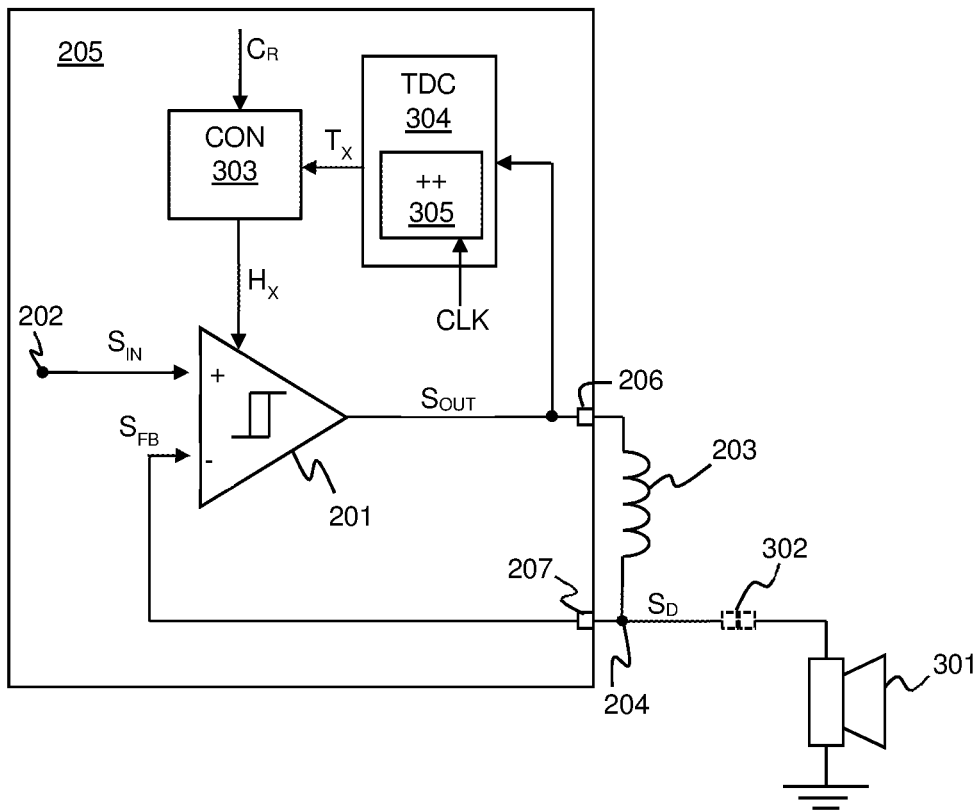
FIG. 3 illustrates an example of an embodiment for driving a resistive load.

As noted above the resistive component 208 may, in some instances, comprise the relevant transducer being driven. FIG. 3 illustrates an embodiment, in which similar components to those illustrated in FIG. 2, are identified using similar components. FIG. 3 illustrates that a transducer 301, which presents a resistive load, is connected to the output node 204 to be driven by the driving signal $S_D$.

In the embodiment of FIG. 3 the transducer 301 provides the resistive component 208 in series with the inductor 203 and thus forms part of the filter of the transducer driving circuitry. This means that the value of the resistance presented by transducer 301 has an impact on the cycle period of the PWM output signal $S_{OUT}$ generated by the hysteretic comparator 201.

As noted above the hysteretic comparator 201 will cyclically alternate between instances of the high output state $V_H$ and the low output state $V_L$ to effectively increase and then decrease the voltage at the output node 204. This cycling between output states of the hysteretic comparator 201 can thus appear as a type of ripple voltage in driving signal $S_D$.

The time spent in each output state in each cycle will depend on how long it takes for the feedback signal $S_{FB}$ to change by the amount defined by the hysteresis, e.g. from a value equal to $S_{IN}$–H to a value $S_{IN}$+H or vice versa. This will depend on the amount of hysteresis and the rate of change of the feedback signal $S_{FB}$. The rate of change of the feedback signal $S_{FB}$ will itself depend on the then-current value of the feedback signal $S_{FB}$, i.e. the voltage at the output node 204, which, as noted above depends on the level of the input signal $S_{IN}$. It will be understood that the rate of current ramping within the inductor 203 will depend on the voltage difference across the inductor 203, which depends on the present output of the hysteretic comparator 201 and the voltage at the output node 204.

For example, if the voltage at the output node is relatively high, e.g. near $V_H$, then, when the hysteretic comparator 201 output is in the high state $V_H$, there will be a relatively small positive voltage difference across the inductor 203 and the inductor current will ramp relatively slowly. It will therefore take a relatively long time for the feedback signal $S_{FB}$ to increase to exceed the input signal $S_{IN}$ by the relevant hysteresis amount, e.g. for $S_{FB}$ to reach $S_{IN}$+H. However once the hysteretic comparator 201 output swaps to the low state $V_L$ there will then be a relatively high negative voltage difference across the inductor and the current will rapidly ramp downwards. Thus it will take only a relatively short period of time for the feedback signal $S_{FB}$ to drop below the input signal $S_{IN}$ by the relevant hysteresis amount, e.g. for $S_{FB}$ to reach $S_{IN}$–H. The reverse would be true if the voltage at the output node were a relatively low voltage.

The duration of a pulse corresponding to the high state $V_H$ in the output signal $S_{OUT}$ (and correspondingly the duration of a pulse corresponding to the low state $V_L$ in the output signal $S_{OUT}$) thus depends on the level of the input signal $S_{IN}$.

Figure 4:
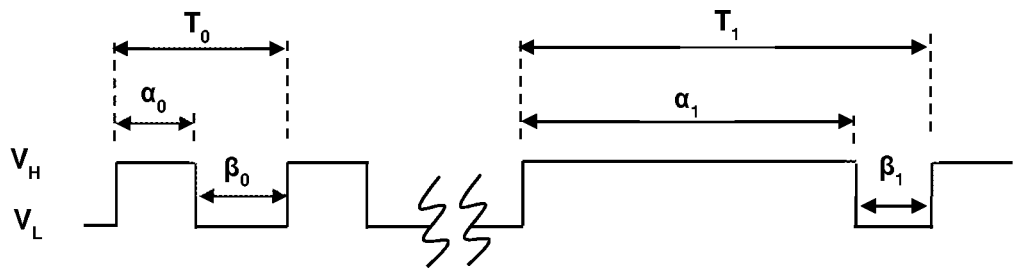
FIG. 4 illustrates the principle of the PWM signal generated by the hysteretic comparator.

FIG. 4 illustrates the principles of the output signal $S_{OUT}$ from the hysteretic comparator in a circuit arrangement such as illustrated in FIG. 2. The duration of a pulse of the high state $V_H$ is denoted by α and the duration of a pulse of the low state $V_L$ is denoted by β. The cycle period T is equal to α+β. The cycle period T can also be seen as the period between an instance of a transition from one output state to the other output state and the next instance of the same transition.

As described above the duration α of the pulse of the high state $V_H$ depends on the level of the input signal $S_{IN}$, as does the duration of the pulse of the low state $V_L$. For signals of zero magnitude (which corresponds to a voltage value equal to the midlevel voltage $V_{MID}$ between $V_H$ and $V_L$) the periods of the pulses of each state, illustrated in FIG. 4 as $α_0$ and $β_0$, will be equal to one another, i.e. each equal to $T_0/2$ where $T_0$ is the cycle period at zero magnitude.

If the magnitude of the input signal $S_{IN}$ increases the duration of the pulse of one state will increase and the duration of the pulse of the other state will decrease to first order by:

$$\alpha = T_0/2 \cdot (1-X) \quad \beta = T_0/2 \cdot (1+X) \qquad \text{(eqn. 1)}$$

where X is the level of the normalised input signal, i.e.

$$X = S_{IN}/S_{MAX} \qquad \text{(eqn. 2)}$$

where $S_{MAX}$ is the maximum magnitude of the input signal defined as $(V_H-V_L)/2$, i.e. X is a level of the input signal normalised with respect to an input range to lie within a range +1 to −1, where a magnitude of 1 corresponds to a signal level that asymptotically leads to an output frequency of zero.

It will be appreciated from equation 1 that increase in duration of one pulse is not equal to the decrease in duration of the other pulse and the overall cycle period T will change approximately according to:

$$T = \alpha + \beta = T_0/(1-X^2) \qquad \text{(eqn. 3)}$$

Thus any increase in the magnitude of the input signal (from zero magnitude) will result in an increase in the cycle period, as illustrated by the durations $α_1$ and $β_1$ and duration $T_1$ for a cycle period at a non-zero input signal magnitude. Thus the cycle period $T_0$ (equal to $α_0+β_0$) corresponding to an input signal of zero magnitude will be the cycle period of shortest duration. This condition is referred to as the "limit cycle" and the period $T_0$ is the "limit cycle period". This corresponds to the fastest cycle frequency $f_0=1/T_0$ which is referred to as the "limit cycle frequency".

For the embodiment illustrated in FIG. 2, with an inductor 203 of inductance L in series with a resistive load 208 having a resistance R, the limit cycle period is given by:

$$T_0=(2L/R)\cdot\ln\{(V_{MID}+H)/(V_{MID}-H)\} \quad\text{(eqn. 4)}$$

where H is indicative of the amount of hysteresis. For H small compared to $V_{MID}$ this may be approximated as:

$$T_0\approx(2L/R)\cdot\ln\{(1+2H/V_{MID})=4(L/R)\cdot H \quad\text{(eqn. 5)}$$

It can therefore be seen from equations 4 or 5 that the limit cycle period, and hence frequency for the PWM signal $S_{OUT}$, thus depends on the value of the resistance R of the resistive component 208. Further it can be seen from equation 3 that the cycle period of the PWM signal $S_{OUT}$ can vary significantly from this limit cycle frequency with increasing magnitude of the input signal $S_{IN}$.

As noted above the voltage VD of the driving signal $S_D$ will include a ripple component at the frequency of the cycle period of the PWM output signal $S_{OUT}$. Generally it may be desirable to ensure that such a component does not extend into the signal band of interest.

If the resistance R of the resistive component 208, e.g. the transducer 301, is known, then it may, in some instances, be possible to select an appropriate value for the inductance L of inductor 203 and hysteresis value H that ensures that the cycle period is always outside the signal band of interest for the expected input signal $S_{IN}$ levels.

However in some instances the resistance R of the transducer 301 may not be known. For instance, if the hysteretic comparator 201 were implemented as an integrated circuit 205, possibly with an integrated inductor 203, the manufacturer of the integrated circuit 205 may not know what transducer 301 a device manufacturer may choose to use in a host device. In some implementations the circuit 205 may be operable, in use, with different transducers, especially for instance if the transducer 301 is a transducer of an accessory apparatus connected via some suitable connection 302. In such cases therefore it may not be possible to design the transducer driving circuitry for operation with a specific transducer resistance.

Also, even if the resistance of the transducer 301 is known it may not be desirable or practical in some implementations to use a value of inductance L to ensure that the cycle period does not extent into the signal band of interest, at least not without some compromise on performance.

To avoid these issues, FIG. 3 illustrates that the transducer driving circuitry 205 may include a controller 303 for controlling the cycle period of the PWM output signal $S_{OUT}$. In the example illustrated in FIG. 3 the controller 303 is a hysteresis controller operative to apply adaptive hysteresis control so as to vary the hysteresis applied by the hysteretic comparator 201, i.e. the magnitude of the hysteresis. In the embodiment of FIG. 3 the transducer driving circuitry monitors the output signal $S_{OUT}$ from the comparator 201 and adjusts the applied hysteresis accordingly, for instance to maintain the cycle period in a defined range.

The embodiment of FIG. 3 thus includes a Time-Decoding-Converter (TDC) 304 that receives the output PWM signal $S_{OUT}$ and determines a time parameter $T_X$ of the PWM output signal $S_{OUT}$. The time parameter $T_X$ may be any parameter of the time PWM signal $S_{OUT}$ that varies with signal magnitude in a known way. Conveniently the time parameter $T_X$ may be the present cycle period T, although equally the time parameter could be the duration of a pulse of one output state, α or β, or the duty cycle α/T. This time parameter $T_X$ is provided to adaptive hysteresis controller 303, which controllably varies the hysteresis $H_X$ applied by the hysteretic comparator 201. There are many ways the magnitude of the hysteresis applied by a hysteretic comparator 201 may be varied as will be understood by one skilled in the art.

As noted above in equation 4, the limit cycle period varies with the hysteresis H applied by the hysteretic comparator 201. The hysteresis controller 303 may thus controllably vary a value $H_X$ of the hysteresis applied by the hysteretic comparator 201 so as to reduce the amount of hysteresis applied as the magnitude of the input signal increases, as indicated by the time parameter $T_X$, so as to maintain the cycle period, and hence the cycle frequency, within a defined range. Where the time parameter is the cycle period, the controller 303, i.e. the adaptive hysteresis controller, may reduce the amount of hysteresis as the time period T increases and vice versa in order to reduce the variation in the time period T by this feedback.

In some instances the hysteresis may be generally controlled according to:

$$H_{MX}=H_0\cdot(1-X_e^2) \quad\text{(eqn. 6)}$$

where $H_0$ is the hysteresis applied at zero signal magnitude and $X_e$ is an estimate of the normalised signal X, derived from the time parameter. Then combining equations 3 and 5 and substituting for $H_M$:

$$\begin{aligned}T &\approx 4(L/R)\cdot H_X/(1-X^2) \\ &= 4(L/R)\cdot H_0\cdot(1-X_e^2)/(1-X^2)\end{aligned} \quad\text{(eqn. 7)}$$

Thus, assuming the estimate Xe is an accurate estimate of the actual X, the last two terms cancel and $$T\approx T_0\approx 4(L/R)\cdot H_0 \quad\text{(eqn. 8)}$$

For economic but adequate hysteresis control a relatively accurate or precise indication of the level of the input signal may not be needed and it may be sufficient to determine the time parameter $T_X$ relatively crudely. The TDC 304 may, in some embodiments comprise a counter 305 which is clocked by a reference clock signal CLK. The counter 305 may be configured to determine at least one count value of the number of reference clock cycles in a portion of the cycle period corresponding to the relevant time parameter, for instance the counter 305 may count the number of reference clock cycles in each period between successive rising edges in the output signal $S_{OUT}$ and provide the cycle-by-cycle count value as the measure $T_X$ of the cycle period T, although in other implementations the count values may be used to determine the duty cycle or a count of the duration of one of the pulse, e.g. the duration α, may be sufficient. As mentioned for the hysteresis control, a high level of accuracy may not be needed and thus the reference clock signal CLK need only be fast enough to provide the required time resolution of the period or pulse length of the time encoded signal.

The hysteresis controller 303 may be implemented as part of an integrated circuit 205 with the hysteretic comparator 201 and used to generate a driving signal $S_D$ for any of a range of different transducers. The hysteresis controller 303 may control the hysteresis to maintain the cycle period of the PWM signal $S_{OUT}$ in a range defined by a control setting $C_R$.

The speed and bandwidth of this hysteresis control loop, i.e. the TDC 304 and hysteresis controller 303 should be relatively high so that the circuit responds rapidly to any changes in cycle period.

Figure 5:
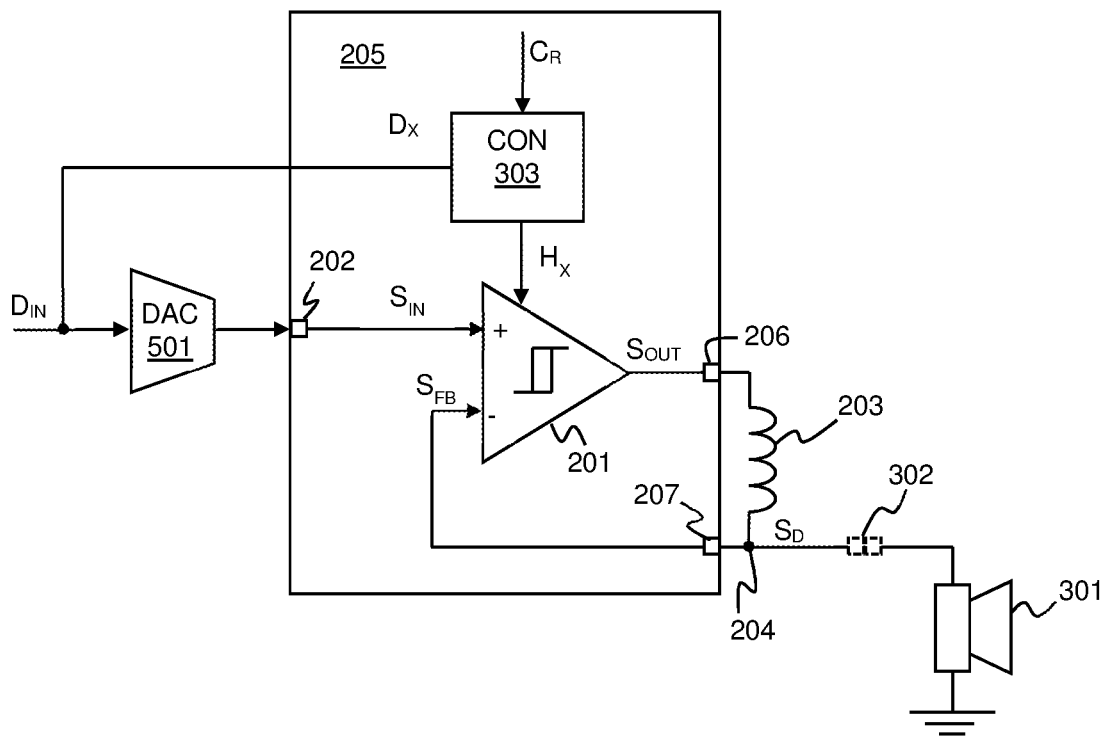
FIG. 5 illustrates another example of a transducer driving circuit that receives a look-ahead signal indicative of the input signal.

FIG. 5 illustrates a further embodiment in which similar components to those discussed previously are identified by the same reference numerals. The embodiment of FIG. 5 includes a hysteretic comparator 201 whose hysteresis $H_X$ is controlled by control block 303. In this embodiment the control block 303 is configured to accept an indication Dx of an estimate Xe of the signal to be driven, rather than a time parameter. This estimate Xe may be obtained from a module/circuitry upstream of the comparator signal input node 202, rather than from monitoring the comparator output at the PWM node 206. For instance, as illustrated in FIG. 5 a digital signal may be available from the signal path prior to an upstream digital-to-analogue converter (DAC) 501. The indication Dx may constitute a look-ahead signal that is derived from the signal path ahead of circuitry that has inherent delay and that is already in the signal path, such as the DAC 501. Alternatively and/or additionally, the indication Dx may constitute a look-ahead signal that is derived from the signal path ahead of a delay block/circuitry (not illustrated) that has purposely been introduced into the signal path. The purpose of the look ahead signal being to advantageously allow the control block 303 and comparator 201 time to react when the, otherwise delayed, input signal $S_{IN}$ arrives at the input (+) of the hysteretic comparator 201.

In some embodiments the indication $D_X$ input to the control block 303 may comprise all bits of a digital input signal $D_{IN}$ or may only comprise a number of the most significant bits (MSBs) that may still afford adequate resolution. The indication $D_X$ may also be a version of $D_{IN}$ at a different sample rate. Indication $D_X$ may be subject to some retiming to synchronise changes in the hysteresis value applied to the comparator to avoid changes in hysteresis on data changes of $D_X$ from causing immediate changes in comparator output, i.e. to avoid the comparator output edges becoming at least partly synchronised to the sample clock of $D_{IN}$. However, in some embodiments the sample rate of $D_X$ and/or the DAC output may be high enough relative to the PWM pulse widths that the comparator switching is deliberately synchronised to a high speed sampling clock.

The above description of the embodiments of FIG. 3 and FIG. 5 illustrate the transducer driving circuitry being arranged to drive a resistive load, i.e. the only significant impedance connected to output node 204, other than the inductance 203, is the resistance of transducer 301.

Figure 6:
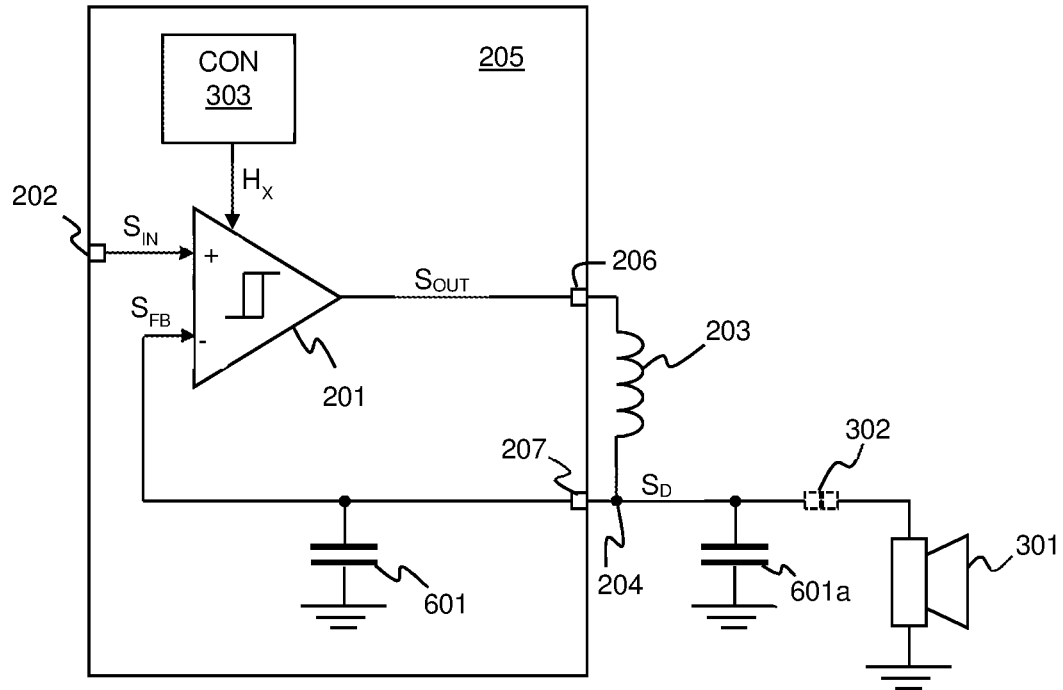
FIG. 6 illustrates another example of an embodiment for driving a resistive load.

In some instances with a resistive load 301 it may be beneficial to connect a capacitance to the output node 204. FIG. 6 illustrates transducer driving circuitry in which similar components to those discussed previously are identified by the same reference numerals. The capacitance may, in effect, be connected in parallel with the transducer 301. Where the hysteretic comparator 201 is implemented as at least part of an integrated circuit 205 some or all of this capacitance may be formed as part of the integrated circuit 205 as illustrated by capacitor 601 or some or all of this capacitance may be implemented as an off-chip component as illustrated by capacitor 601a.

The capacitance 601 and/or 601a and inductance 203 in cooperation with the load resistance 301 may be regarded as applying a second-order filter, rather than a first-order LR filter as illustrated in the embodiments of FIGS. 2 and 3, to the variable duty-cycle square wave of voltage on node 206 so as to provide the waveform on output node 204. A second order filter may more strongly attenuate higher-frequency voltage components applied to the load, and thus the energy dissipated by such components in the load resistance may be less. Also higher-frequency electromagnetic emissions may be reduced. Also the value of inductance required in conjunction with a selected capacitance may be smaller, possibly by an order of magnitude, allowing a physically smaller and/or cheaper inductor to be used.

The transducer illustrated in FIG. 3 or 5 may also present a more complex impedance to the driving circuitry than a pure resistance. For example an electrodynamic loudspeaker may have inductance and stray capacitance associated with a voice coil, and coil motion may induce back e.m.f. effects when driven, possibly including peaking due to mechanical resonances or mechanical or acoustic power dissipation that may be modelled by electrical equivalent circuits including further inductance and capacitance and resistances. However operation may still be qualitatively similar and/or these effects allowed for in the detailed design and component value choice.

Figure 7:
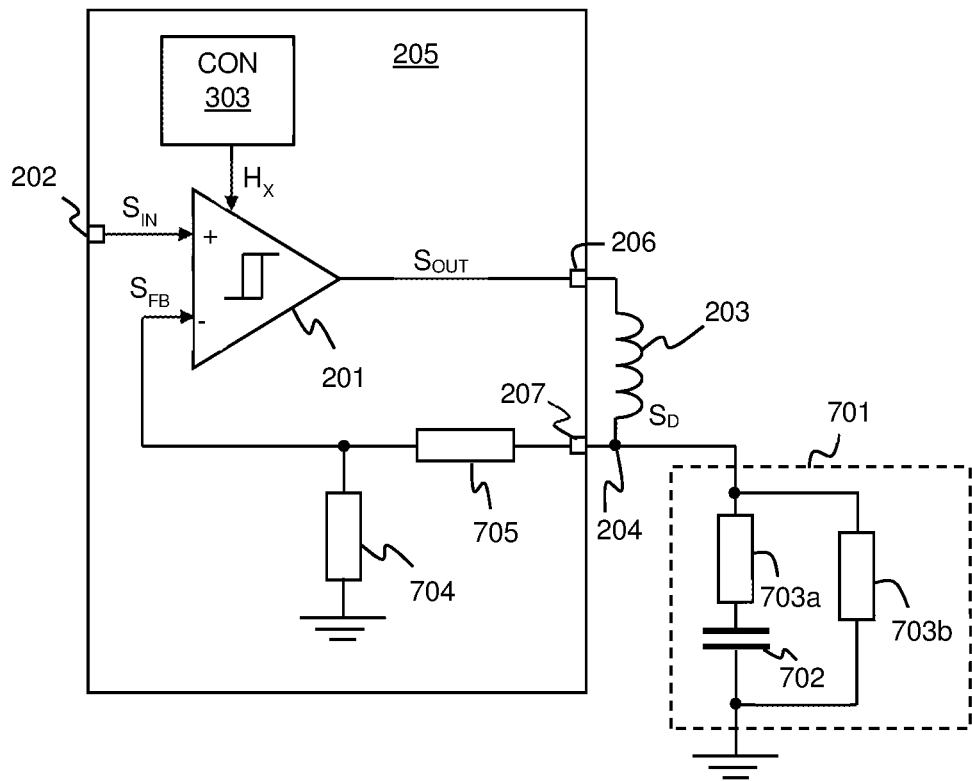
FIG. 7 illustrates an example of an embodiment for driving a capacitive load.

The transducer driving circuitry may also be implemented to drive a capacitive transducer load, as illustrated in FIG. 7. FIG. 7 illustrates transducer driving circuitry in which similar components to those discussed previously are identified by the same reference numerals.

In this instance the transducer 701 may be a transducer that presents a capacitive load. Such a transducer may, for instance, be a piezoelectric transducer as may be used for ultrasonic emission or may be a haptic actuator or an electrostatic or MEMS loudspeaker. The transducer 701 may present a substantially capacitive load 702. However in practice since there is power being dissipated (vibrations/acoustic signals) by the transducer 701, this has to be reflected in an electrical equivalent circuit for the transducer 701, for instance by including a series resistance element 703a and/or parallel resistance element 703b as illustrated.

A more complete model of the transducer 701 may need to include other effects such as mechanical resonances or mechanical or acoustic power losses that may be modelled by electrical equivalent circuits including further inductance and capacitance and resistances. However operation may still be qualitatively similar and/or these effects may be allowed for in the detailed design and/or component value choice.

The principle of operation of the embodiment of FIG. 7 is essentially the same as described previously. Such an arrangement provides a very compact, simple and power efficient driver circuit for a capacitive acoustic output transducer.

FIG. 7 also illustrates that the feedback path from the output node 204 to the second comparator input (−) may not be a direct connection. In this example the feedback path is coupled via a resistive voltage divider (704, 705). This is advantageous in that the comparator's input stage (not separately illustrated) and any upstream circuitry may operate from a relatively low supply voltage, for power efficiency and chip area and cost reasons. Conversely the transducer 701 may require a relatively high signal swing driving it in order to produce a strong enough output and therefore the comparator's output stage (not separately illustrated) may thus need special or large structures, e.g. transistors, to drive the transducer which consequently means the comparator's output stage needs a relatively high supply voltage. The potential divider allows the feedback signal $S_{FB}$ presented to the comparator's input stage to be within the range of the relatively low supply voltage of the comparator's input stage rather than being within the range of the relatively high supply voltage of the comparator's output stage.

As noted above, in various embodiments the hysteretic comparator 201 may be formed as part of an integrated circuit, which could be an audio circuit such as a codec or the like or some other driver circuit. In an integrated circuit embodiment the circuit may include an adaptive hysteresis controller 303 to maintain the cycle period of the PWM output signal $S_{OUT}$, and hence on ripple component of the driving signal $S_D$ within certain limits with a range of different transducers. The input signal $S_{IN}$ supplied to the hysteretic comparator 201 is a voltage signal and may comprise an analogue signal received at the integrated circuit or the integrated circuit may comprise a digital-to-analogue converter (DAC) to convert a received digital signal into the input signal $S_{IN}$ for the hysteretic comparator.

Figure 8:
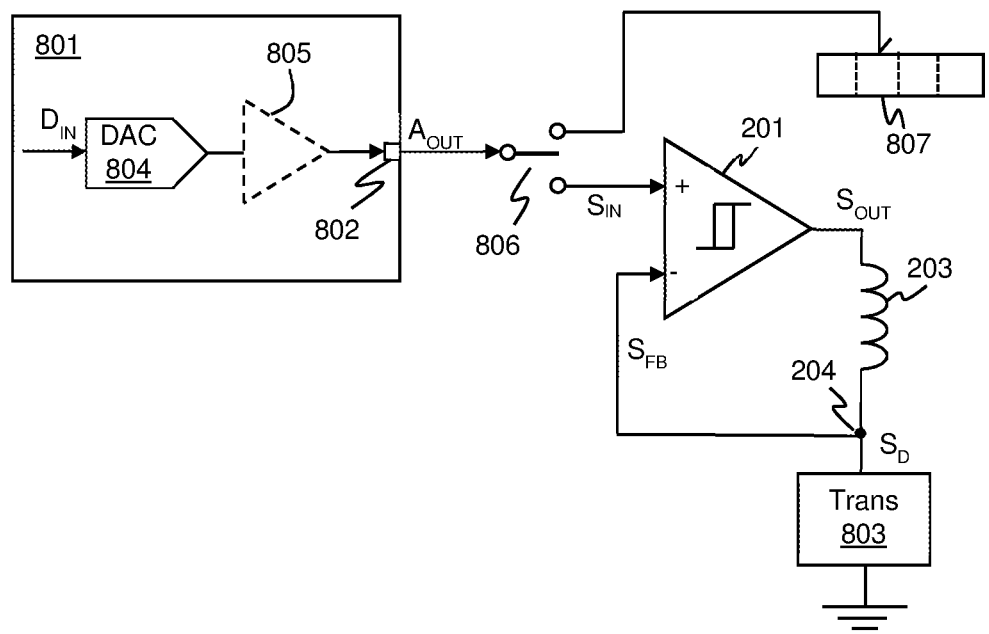
FIG. 8 illustrated an embodiment of off-chip transducer driving circuitry.

In some embodiments however a transducer driving circuit may be implemented externally to an integrated circuit for providing the input signal $S_{IN}$, that is to say the hysteretic comparator 201 may be provided as an off-chip component, for instance assembled or located on a PCB of the host device. FIG. 8 illustrates an embodiment where an integrated circuit 801, for instance an audio circuit 801 such as a codec or the like, outputs an analogue output signal $A_{OUT}$ at a terminal 802. A hysteretic comparator 201 is arranged as an off-chip component to receive the analogue output signal $A_{OUT}$ as the comparator input signal $S_{IN}$. The output of the comparator is coupled to an off-chip inductor 203 with a feedback path from the other side of the inductor to the second input of the hysteretic comparator. The output node 204 of a transducer driving circuit comprising comparator 201 and inductor 203 is coupled to a transducer 803, which may be a purely resistive load, or a purely capacitive load (in which case there may be series resistance) or a mixed capacitive and resistive load.

A hysteretic comparator can be readily implemented by a few off-chip components and the inductor may in any case be an off-chip component. Such a transducer driver circuit can thus be easily implemented as off-chip components, e.g. mounted on a printed circuit board or the like, and provides a simple and low cost way of driving a transducer.

Figure 9:
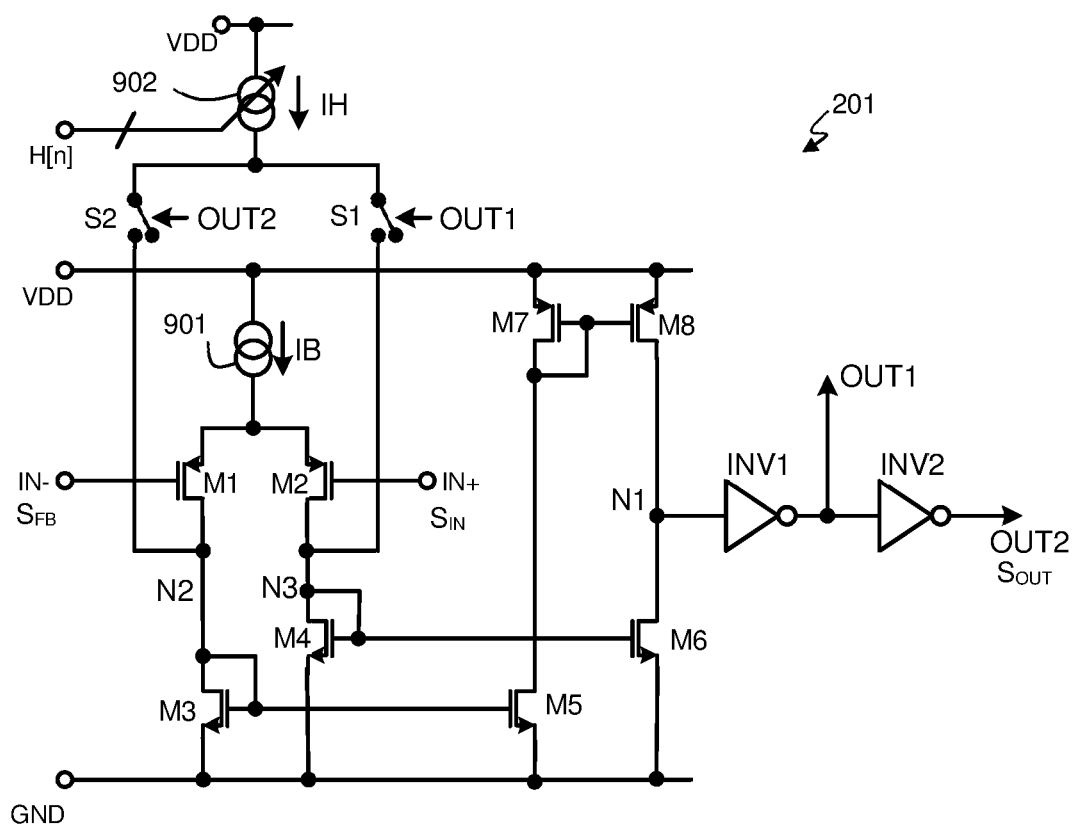
FIG. 9 illustrates one example of a hysteretic comparator with controllable hysteresis.

FIG. 9 illustrates one example a simple hysteretic comparator circuit 201 with programmable hysteresis. MOS transistors M1 to M8 are arranged as a differential-input MOS comparator with a first input (IN+) and a second input (IN−). When used in embodiments of the transducer driving circuitry the first input (IN+) may receive the input signal $S_{IN}$ and the second input (IN−) may receive the feedback signal $S_{FB}$. Bias current source 901 outputs a bias current IB to both input branches. The operation of the differential-input MOS comparator with bias source 901 would be such that, if the voltages at the first and second inputs IN+ and IN− were equal then (assuming, for simplicity of explanation, that all transistor widths and lengths are equal) each of the eight transistors M1 to M8 would pass a current equal to IB/2. In particular, transistors M8 and M6 would pass exactly the same current and node N1 will be ideally mid-way between the supply voltage VDD and a reference voltage, in this case ground. If the voltage at the first input IN+ increases relative to the voltage at the second input IN−, i.e. goes higher, the voltage on node N1 will go high. Conversely, if the voltage at the first input IN+ were to decrease below the voltage at the second input IN− the voltages at node N1 will go low. The voltage at node N1 is buffered to provide the output signal $S_{OUT}$. The voltage at node N1 is buffered by series connected inverters INV1 and INV2 to provide output signals OUT1 and OUT2, where OUT2 is in phase with the voltage at node N2 and OUT1 is an inverted version. The output signal $S_{OUT}$ may be derived from the buffered output OUT2. Were the comparator implemented by transistors M1 to M8 operated just with bias source 901, the switching point, i.e. the point at which the comparator output would change state, would be the point at the voltages at the first and second input IN+ and IN− are equal. The operation of the comparator circuitry would be symmetric in that the change from low-to-high would occur at the same point as the change from high-to-low.

In addition to this symmetric comparator circuitry, the hysteretic comparator circuit 201 includes current source 902 that outputs a current IH and switches S1 and S2 (typically implemented using MOS transistors). In operation, if OUT2 is high, indicating that voltage at the first input IN+ has been higher than that at the second input IN−, then switch S2 allows current IH to be injected intro node N2. In order for both M3 and M4 to now pass equal current, (equal to (IB+IH)/2) then transistor M1 must carry a current equal to IB/2−IH/2 and transistor M2 must carry a current equal to IB/2+IH/2. Thus the switching point is now such that second input IN− must be at a significantly higher voltage than the first input IN+ rather than just equal (or very marginally greater).

The amount of this hysteresis is dependent on the magnitude of IH and the transconductance of input transistors M1 and M2. It is greater for larger values of IH. Thus IH may be provided as a digitally programmable current source (e.g. comprising a plurality of MOS current sources in parallel, with bits of a digital word H[n] either turning each element on or off or steering the respective currents to N2 and/or N3.

In some embodiments switches S1 and S2 may comprise multiple switches in parallel to a plurality of current sources of equal or say binary-weighted magnitudes, controlled by a logical combination of OUT, OUTB and H[n].

Referring back to FIG. 8 the analogue output signal $A_{OUT}$ may be provided by a simple DAC 804 on the integrated circuit 801 although in some instances there may be an on chip amplifier 805. In some instances the output 802 of the driver circuit 801 could be multiplexed between the input to the hysteretic comparator 201, for driving the on-board transducer 803, or a second signal path, which may for instance be a signal path for connecting to an accessory device via a suitable contact 807 of a device connector.

It will be understood that in embodiments of the disclosure the input signal $S_{IN}$ of interest is a signal with some time varying signal component that comprises some information content for driving an acoustic transducer. Note that as used herein the term acoustic shall be used to refer to transducers that operate by generating some pressure wave or vibration as the output. The term acoustic shall not be taken to imply any particular frequency range and is not used restricted to producing sound in the human audible hearing range. The term audio is also not restricted to frequencies in the human audible hearing range and the term audio shall be used to include ultrasonic frequencies and signals for driving haptic transducers.

Thus the input signal $S_{IN}$ is not a reference voltage having a constant level or having some defined variation that does not vary from cycle-to-cycle, e.g. a triangular waveform or the like. The input signal $S_{IN}$ may, for instance, be a time varying voltage signal. In some implementations the input signal $S_{IN}$ could, for example, be an analogue input signal such as an analogue audio signal or an analogue signal derived from an audio signal. Likewise, the driving signal $S_D$ is thus a time varying signal that comprises some information content for driving an acoustic transducer to reproduce the content. The output signal is not simply a power supply for the transducer.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more output transducers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A transducer driver circuit comprising:
an input node for receiving an input acoustic signal waveform;
an output node for outputting a driving signal waveform into an acoustic output transducer:
a hysteretic comparator configured to compare, with hysteresis, the input signal waveform received at a first comparator input to a feedback signal received at a second comparator input and to generate a pulse-width modulation (PWM) signal at a comparator output;
a time-to-digital-converter configured to receive a reference clock signal and the PWM signal and output a digital control signal based on a parameter of the PWM signal, wherein the time-to-digital converter comprises a counter configured to produce at least one count value of the number of clock cycles of the reference clock signal in a period defined by the parameter of the PWM signal;
a hysteresis controller configured to receive the digital control signal and control hysteresis of the hysteretic comparator based on the PWM signal;
an inductor coupled between the comparator output and the output node; and
a feedback path between the output node and the second comparator input to provide the feedback signal.

2. A transducer driving circuit as claimed in claim 1 wherein said parameter comprises one of: a duration of a cycle period of the PWM signal; a duty-cycle of the PWM signal and a duration of a pulse of the PWM signal.

3. A transducer driving circuit as claimed in claim 1 wherein the hysteresis controller is configured to control the hysteresis of the hysteretic comparator based on an indication of a level of the input signal waveform.

4. A transducer driving circuit as claimed in claim 1 further comprising an acoustic output transducer coupled to be driven by the driving signal waveform at the output node.

5. A transducer driving circuit as claimed in claim 4 wherein the transducer comprises a resistive load.

6. A transducer driving circuit as claimed in claim 5 further comprising a capacitance connected between the output node and a reference potential.

7. A transducer driving circuit as claimed in claim 4 wherein the transducer comprises a capacitive load.

8. A transducer driving circuit as claimed in claim 7 comprising a resistance in series between the transducer and the output node.

9. A transducer driving circuit as claimed in claim 4 wherein the transducer comprises at least one of: a piezoelectric transducer, a haptic output transducer; an ultrasonic output transducer and an audible audio output transducer.

10. A transducer driving circuit as claimed in claim 1 wherein the hysteretic comparator is formed as at least part of an integrated circuit.

11. A transducer driving circuit as claimed in claim 10 wherein the inductor is an external component to the integrated circuit and is coupled to the integrated circuit.

12. A transducer driving circuit as claimed in claim 1 wherein the hysteretic comparator is not implemented as part of an integrated circuit and the transducer driving circuit is coupled to a first output of an integrated circuit and is operable so that an analogue output signal at said first output can be supplied to the hysteretic comparator as said input signal waveform.

13. A transducer driving circuit as claimed in claim 12 wherein the transducer driving circuit is coupled to said first output of the integrated circuit via a switch arrangement, wherein the switch arrangement is operable to selectively supply the analogue output signal at said first output to the hysteretic comparator or to a second signal path wherein said second signal path leads to a contact of a device connector for making a connection with a removable accessory apparatus.

14. An electronic device comprising a transducer driving circuit as claimed in claim 1.

15. A transducer driver circuit for driving a transducer comprising:
an input node for receiving an input time-varying signal waveform;
a PWM node for outputting a pulse-width modulation (PWM) signal to a transducer via an inductor;

a feedback node for receiving a feedback signal from downstream of the inductor;

a hysteretic comparator having a first comparator input coupled to the input node; a second comparator input coupled to the feedback node and a comparator output coupled to the PWM node, the hysteretic comparator being configured to compare the feedback signal to the input signal to generate the PWM signal;

a time-to-digital-converter configured to receive the PWM signal and a reference clock signal and output a digital control signal based on a parameter of the PWM signal, wherein the hysteresis controller is configured to receive the digital control signal and wherein the time-to-digital converter comprises a counter configured to produce at least one count value of the number of clock cycles of the reference clock signal in a period defined by the parameter of the PWM signal; and a hysteresis controller for controlling hysteresis of the hysteretic comparator based on the PWM signal.

16. A transducer driver circuit comprising:

an input node for receiving an input acoustic signal waveform;

an output node for outputting a driving signal waveform into an acoustic output transducer;

a hysteretic comparator configured to compare, with hysteresis, the input signal waveform received at a first comparator input to a feedback signal received at a second comparator input and to generate a pulse-width modulation (PWM) signal at a comparator output, wherein the hysteretic comparator is not implemented as part of an integrated circuit and the transducer driving circuit is coupled to a first output of an integrated circuit and is operable so that an analogue output signal at said first output can be supplied to the hysteretic comparator as said input signal waveform;

an inductor coupled between the comparator output and the output node; and a feedback path between the output node and the second comparator input to provide the feedback signal.

17. A transducer driving circuit as claimed in claim 16 wherein the transducer driving circuit is coupled to said first output of the integrated circuit via a switch arrangement, wherein the switch arrangement is operable to selectively supply the analogue output signal at said first output to the hysteretic comparator or to a second signal path wherein said second signal path leads to a contact of a device connector for making a connection with a removable accessory apparatus.

\* \* \* \* \*

UNITED STATES PATENT AND TRADEMARK OFFICE
CERTIFICATE OF CORRECTION

PATENT NO. : 10,644,660 B2
APPLICATION NO. : 16/039685
DATED : May 5, 2020
INVENTOR(S) : John Paul Lesso It is certified that error appears in the above-identified patent and that said Letters Patent is hereby corrected as shown below:

In the Claims

1. In Column 15, Line 58, in Claim 1, delete "transducer:" and insert -- transducer; --, therefor.

2. In Column 16, Line 22, in Claim 4, delete "an acoustic output" and insert -- the acoustic output --, therefor.

3. In Column 16, Line 67, in Claim 15, delete "a transducer" and insert -- the transducer --, therefor.

4. In Column 17, Line 19-20, move the limitation "a hysteresis controller . . . on the PMW signal" and insert it above the limitation on Line 9 of -- "a time-to-digital converter . . . of the PMW signal --, therefor.

5. In Column 17, Line 25, in Claim 16, delete "transducer:" and insert -- transducer; --, therefor.

Signed and Sealed this
Thirty-first Day of October, 2023

Katherine Kelly Vidal
*Director of the United States Patent and Trademark Office*